(12) United States Patent
Chou et al.

(10) Patent No.: US 11,993,676 B2
(45) Date of Patent: May 28, 2024

(54) NON-FULLERENE ACCEPTOR POLYMER

(71) Applicant: National Tsing Hua University, Hsinchu (TW)

(72) Inventors: Ho-Hsiu Chou, Hsinchu (TW); Mohamed Hammad Elsayed, Hsinchu (TW); Chih-Wei Juan, Hsinchu (TW); Tse-Fu Huang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 15 days.

(21) Appl. No.: 17/698,771

(22) Filed: Mar. 18, 2022

(65) Prior Publication Data

US 2022/0380524 A1    Dec. 1, 2022

(30) Foreign Application Priority Data

May 14, 2021 (TW) ................. 110117599

(51) Int. Cl.
*C08G 61/12* (2006.01)

(52) U.S. Cl.
CPC ..... *C08G 61/126* (2013.01); *C08G 2261/143* (2013.01); *C08G 2261/148* (2013.01); *C08G 2261/312* (2013.01); *C08G 2261/314* (2013.01); *C08G 2261/3223* (2013.01); *C08G 2261/3241* (2013.01); *C08G 2261/3243* (2013.01); *C08G 2261/3246* (2013.01); *C08G 2261/411* (2013.01); *C08G 2261/91* (2013.01)

(58) Field of Classification Search
CPC ................ C08G 61/123; C08G 61/126; C08G 2261/12; C08G 2261/1412; C08G 2261/1424; C08G 2261/148; C08G 2261/1644; C08G 2261/1646; C08G 2261/3223; C08G 2261/3243; C08G 2261/3246; C08G 2261/126; C08G 2261/124; C08G 2261/95; C08G 2261/91; C08G 2261/344; C08G 2261/364; C08G 2261/414; H01L 51/0043; H01L 51/0036; H01L 51/4253; C07D 417/14; C08L 2205/02; Y02E 10/549
See application file for complete search history.

(56) References Cited

U.S. PATENT DOCUMENTS

2022/0396661 A1* 12/2022 Kwon ................... C09K 11/06

FOREIGN PATENT DOCUMENTS

CN          107298758 A     10/2017

OTHER PUBLICATIONS

Elsayed et al., "Indacenodithiophene-based N-type conjugated polymers provide highly thermally stable ternary organic phovoltaics displaying a performance of 17.5%", J. Mater. Chem. A, Mar. 18, 2021, 11 pages, The Royal Society of Chemistry.

* cited by examiner

*Primary Examiner* — Shane Fang
(74) *Attorney, Agent, or Firm* — The Webb Law Firm

(57) ABSTRACT

A non-fullerene acceptor polymer includes a structure represented by formula (I). Formula (I) is defined as in the specification. The non-fullerene acceptor polymer has an electron donating unit and an electron attracting end group. The non-fullerene acceptor polymer uses phenyl or its derivatives as the linker to form the polymer.

6 Claims, 5 Drawing Sheets

NON-FULLERENE ACCEPTOR POLYMER

CROSS-REFERENCE TO RELATED APPLICATION

This application claims priority to Taiwanese Application Number 110117599 filed May 14, 2021, the disclosure of which is hereby incorporated by reference in its entirety.

BACKGROUND OF THE INVENTION

Field of the Invention

The present disclosure relates to a non-fullerene acceptor polymer. More particularly, the present disclosure relates to a non-fullerene acceptor polymer incorporating the phenyl or its derivatives as the linker.

Description of Related Art

Organic photovoltaic using conjugated molecules as active materials have the advantages of light weight, flexibility, and the source of the raw materials are diversified, which are high-profile material in recent years, wherein non-fullerene acceptors (NFAs) are key to improve the power conversion efficiencies (PCEs) of the organic photovoltaic. The NFAs have become the mainstream materials and indispensable materials for the production of the organic photovoltaic. However, most of the NFAs are organic small molecular structures, while non-fullerene acceptor polymers are still rare. Further, it is still a challenge for non-fullerene acceptor polymers to have both high-efficiency performance and excellent stability.

Therefore, how to develop a novel non-fullerene acceptor polymer and improve the structure of the polymer to achieve the effect of improving the power conversion efficiencies and stability of the organic photovoltaic, which is the goal of the relevant industry.

SUMMARY OF THE INVENTION

According to one aspect of the present disclosure, a non-fullerene acceptor polymer is provided. The non-fullerene acceptor polymer includes a structure represented by formula (I):

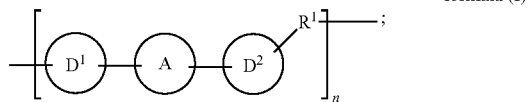

formula (I)

wherein A is an electron donating unit, $D^1$ and $D^2$ are an electron attracting end group, respectively, $R^1$ is phenyl or its derivatives, and n is an integer.

BRIEF DESCRIPTION OF THE DRAWINGS

The present disclosure can be more fully understood by reading the following detailed description of the embodiment, with reference made to the accompanying drawings as follows.

DESCRIPTION OF THE INVENTION

Figure 1:
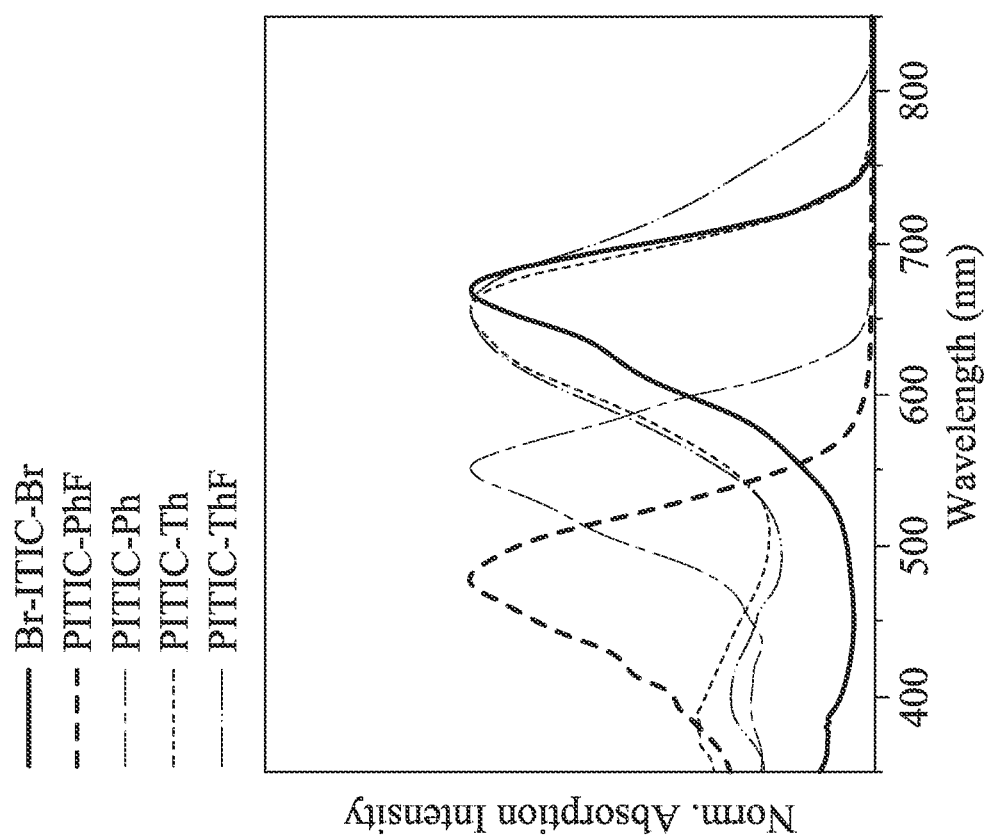
FIG. 1 is a UV-Vis absorption spectra of Br-ITIC-Br, PITIC-PhF, PITIC-Ph, PITIC-Th and PITIC-ThF.

The present disclosure will be further exemplified by the following specific embodiments. However, the embodiments can be applied to various inventive concepts and can be embodied in various specific ranges. The specific embodiments are only for the purposes of description, and are not limited to these practical details thereof.

In the present disclosure, the compound structure can be represented by a skeleton formula, and the representation can omit the carbon atom, the hydrogen atom and the carbon-hydrogen bond. In the case that the functional group is depicted clearly in the structural formula, the depicted one is preferred.

In the present disclosure, in order to concise and smooth, "non-fullerene acceptor polymer includes a structure represented by formula (I)" can be represented as a non-fullerene acceptor polymer represented by formula (I) or a non-fullerene acceptor polymer (I) in some cases, and the other compounds or groups can be represented in the same manner.

Non-Fullerene Acceptor Polymer

A non-fullerene acceptor polymer is provided in the present disclosure, which includes a structure represented by formula (I):

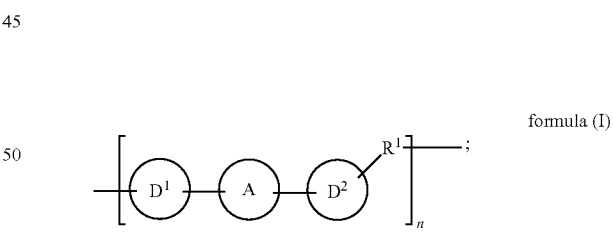

formula (I)

wherein A is an electron donating unit, $D^1$ and $D^2$ are an electron attracting end group, respectively, $R^1$ is phenyl or its derivatives, and n is an integer. Specifically, the non-fullerene acceptor polymer of the present disclosure can be an oligomer with n being 2 to 4, or a macromolecule with n being 4 or more.

In detail, $R^1$ can be a substituted or an unsubstituted benzene compound, a substituted or an unsubstituted aromatic hydrocarbons or a substituted or an unsubstituted fused aromatic ring. Further, $R^1$ can be phenylene, phenyl compound, diphenyl compound, 1, 4-diphenylbenzene, naphthalene, anthracene, phenanthrene or pyrene.

In general, most of the non-fullerene acceptors are organic small molecular structures, while non-fullerene acceptor polymers are still rare. Further, most of the non-fullerene acceptor polymers published today use thiophene as the linker to form a polymer. As mentioned above, the non-fullerene acceptor polymer of the present disclosure uses the $R^1$ which is phenyl or its derivatives as the linker to form the polymer. Compared with the general non-fullerene acceptor, the non-fullerene acceptor polymer of the present disclosure can further improve the element efficiency of the organic photovoltaic and has better stability. In addition, the non-fullerene acceptor polymer of the present disclosure is extremely different from the non-fullerene acceptor monomer and the non-fullerene acceptor polymer linked with thiophene in terms of semiconductor energy gap and semiconductor properties. Therefore, the non-fullerene acceptor polymer of the present disclosure is beneficial to expand the related application fields.

Specifically, the non-fullerene acceptor polymer of the present disclosure is prepared by a non-fullerene acceptor compound which includes a structure represented by formula (II):

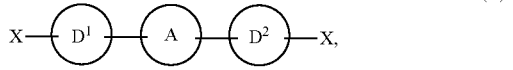

formula (II)

wherein X is a halogen or a functional group capable of polymer polymerization. Furthermore, X can be F, Cl, Br, I, boric acid pinacol ester, boric acid or organotin compound.

In detail, in the non-fullerene acceptor polymer (I) and the non-fullerene acceptor compound (II), A can be a structure represented by formula (A-1) or formula (A-2):

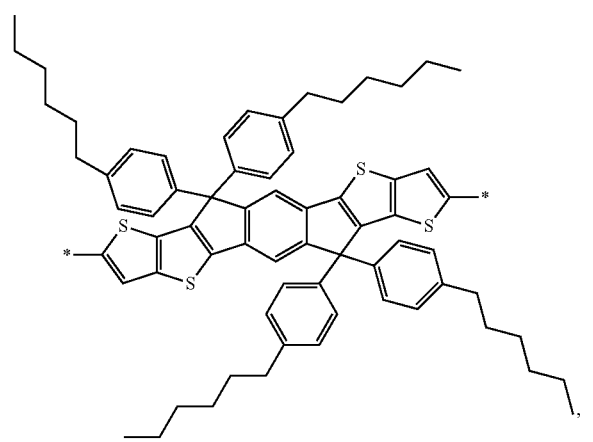

formula (A-1)

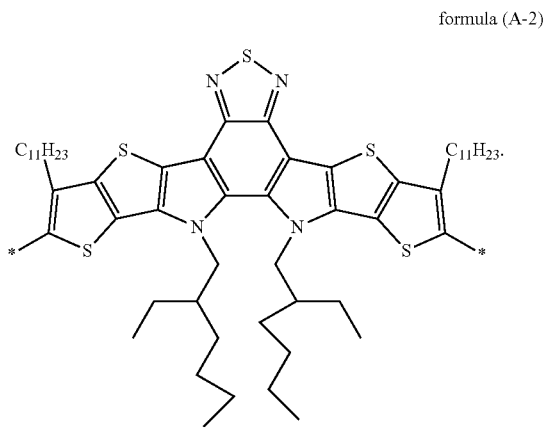

formula (A-2)

In the non-fullerene acceptor polymer (I) and the non-fullerene acceptor compound (II), $D^1$ and $D^2$ are the same or different from each other, and $D^1$ and $D^2$ can be a structure represented by formula (D-1), respectively:

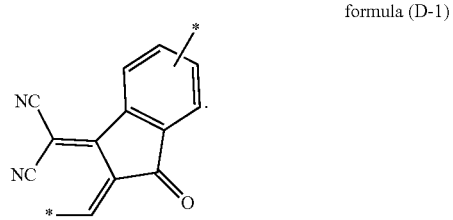

formula (D-1)

It should be mentioned that, the non-fullerene acceptor polymer of the present disclosure is a polymer using $R^1$ as a linker, and the structure of the electron donating unit of A and the electron attracting end group of $D^1$ and $D^2$ are not limited to the above-mentioned structures, it can be adjusted according to the required characteristics.

Reference will now be made in detail to the present embodiments of the present disclosure, examples of which are illustrated in the accompanying drawings.

Example 1, Example 2 and Example 3

Please refer to Table 1, the structural formulas and abbreviations of the non-fullerene acceptor polymer of Example 1, Example 2 and Example 3 of the present disclosure are shown in Table 1.

TABLE 1

| Example | structural formula | abbreviation |
|---|---|---|
| 1 | | PITIC-Ph |
| 2 | | PITIC-PhF |
| 3 | | PBTP-PhF |

Specifically, Example 1 and Example 2 are ITIC-based non-fullerene acceptor polymer. The electron attracting end group of Example 1 is phenylene, and Example 1 is named PITIC-Ph. The electron attracting end group of Example 2 is tetrafluorobenzene, and Example 2 is named PITIC-PhF. Example 3 is BTP-based non-fullerene acceptor polymer. The electron attracting end group of Example 3 is tetrafluorobenzene, and Example 3 is named PBTP-PhF. It should be mentioned that, the structure of the non-fullerene acceptor polymer of the present disclosure will not be limited thereto.

A Manufacturing Method for Example 1
(PITIC-pH)

In the manufacturing method of PITIC-Ph, Br-ITIC-Br is prepared first which is used as a monomer to polymerize into a non-fullerene acceptor polymer. The manufacturing process of PITIC-Ph will be described in detail below.

The synthesis reaction of Br-ITIC-Br (Compound 7) is shown in Table 2.

TABLE 2

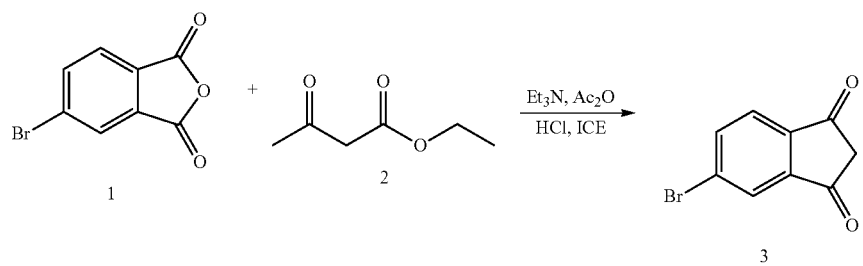

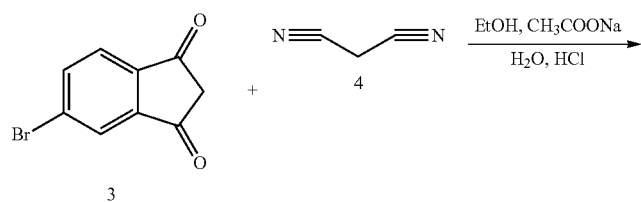

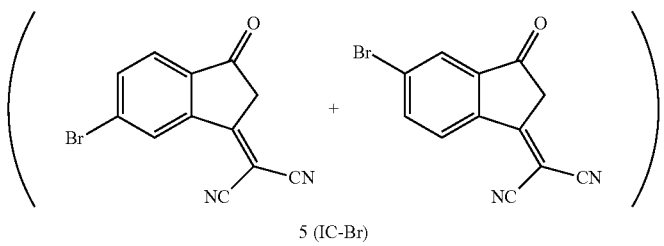

5 (IC-Br)

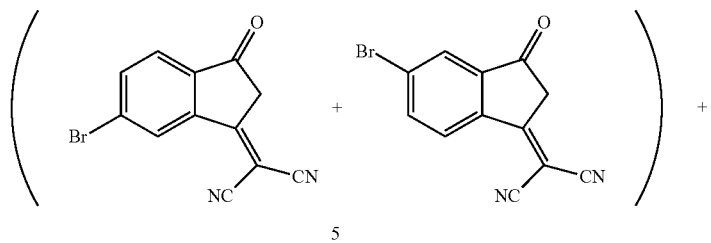

5

TABLE 2-continued

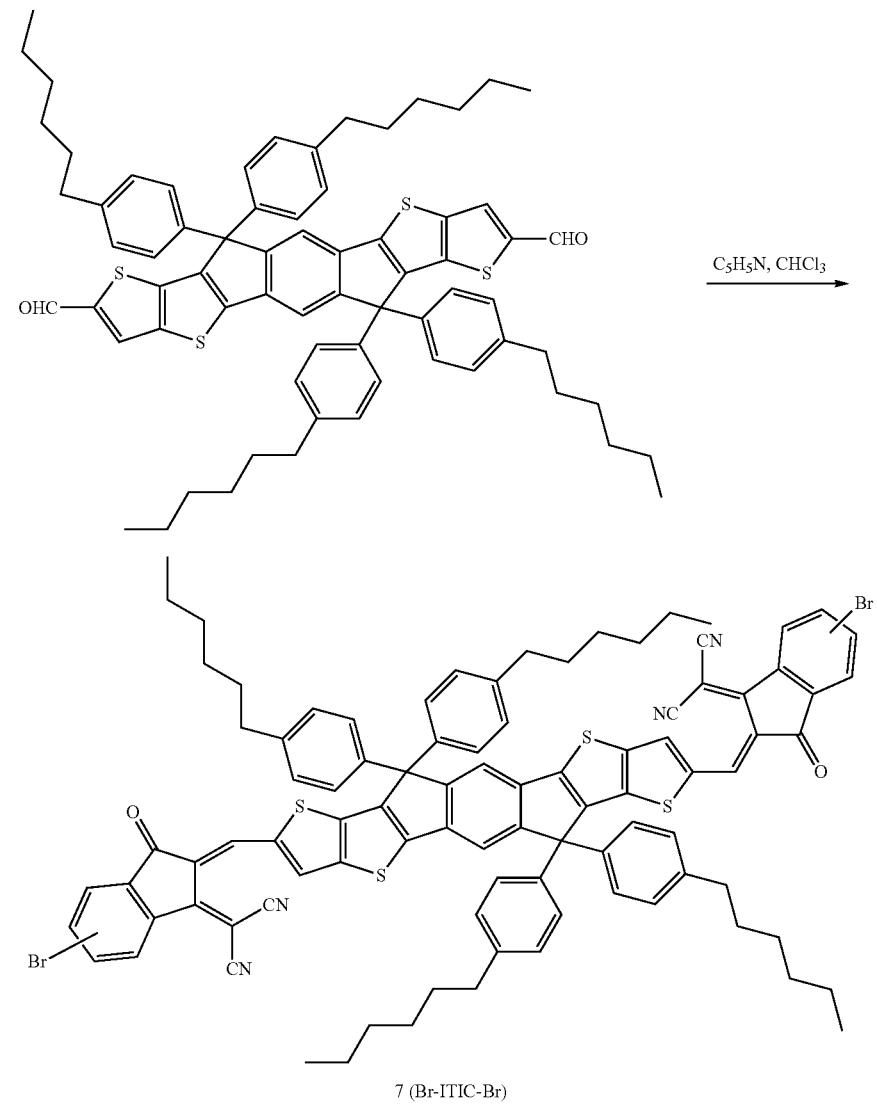

7 (Br-ITIC-Br)

The synthesis of Compound 3 (5-bromo-1H-indene-1, 3(2H)-dione) is shown as follow. Compound 1 (4-bromophthalic anhydride) (5 g, 22 mmol), acetic anhydride (12 mL) and triethylamine (6.5 mL) is added to a two-necked round bottom flask under a nitrogen atmosphere so as to form a solution. Then Compound 2 (ethyl acetoacetate) (3.15 mL) is added quickly in the solution under argon. The solution color will be changed from orange to red after adding Compound 2. The solution is stirred at room temperature for 22 hours, and then ice-water (8.5 g) and concentrated HCl (8 mL) are added to the solution followed by addition of 5M HCl (35 mL). After that, the solution is stirred at 80° C. for 15 minutes and forms a crude product. After the crude product is cooled to room temperature, water is added, and the solution is extracted with dichloromethane (DCM). The organic phase of the solution is taken, and the solvent of the solution evaporated under reduced pressure. The dried solid is dissolved in a minimum volume of acetone and cooled to −20° C. The product is collected by filtration and then dried under high vacuum to give Compound 3 which obtained as a brown solid.

The NMR spectroscopy data of Compound 3 analyzed by NMR spectrometer is shown in the following: $^1$H-NMR (500 MHz, $CD_2Cl_2$): δ 8.1 (s, 1H), 7.94 (d, 1H), 7.83 (d, 1H), 3.23 (s, 2H).

The synthesis of Compound 5 (2-(5(6)-bromo-3-oxo-2, 3-dihydro-1H-inden-1-ylidene) malononitrile) is shown as follow. Compound 3 (2.33 g, 10.35 mmol) and malononitrile (1.37 g, 20.7 mmol) are mixed in 40 mL ethanol in a 250 mL single neck round bottom flask and stirred for 30 minutes at room temperature and so as to form a solution. Then, anhydrous sodium acetate (1.28 g, 15.52 mmol) is added to the reaction, and the solution is stirred at room temperature for 2 hours. The 40 mL water is added into the solution, and the solution is stirred at room temperature for half an hour. Then, concentrated HCl dropped in the solution to acidify the mixture with PH=2, and a precipitate is obtained. The precipitate is filtered and washed with water many times to obtain a crude product. The crude product is further purified by flash column chromatography to afford Compound 5 as yellow solid.

The NMR spectroscopy data of Compound 5 analyzed by NMR spectrometer is shown in the following: $^1$H NMR (500

MHz, CDCl$_3$): δ 8.75 (s, 1H), 8.49 (d, 1H), 8.1 (s, 1H), 7.97 (m, 1H), 7.82 (d, 1H), 3.72 (d, 2H).

The synthesis of Compound 7 is shown as follow. Compound 5 (558 mg, 2.04 mmol) and Compound 6 (400 mg, 0.38 mmol) are added to a 250 mL two-necked round bottom flask and to form a solution. After being rinsed with a mild stream of nitrogen for 10 minutes, then anhydrous chloroform (100 mL) is added to the solution. Pyridine (2 mL) is added to reaction, the solution turned green gradually. Then, the solution is placed in an oil bath at 65° C. stirred and refluxed for 12 hours. After the reaction was completed, the solution is cooled to room temperature and a crude product is obtained. The crude product is poured to methanol (400 mL) so as to obtain a precipitate. The precipitate is filtered and purified by flash column (DCM/Hexane (1:1)) to finally obtain Br-ITIC-Br (Compound 7).

The NMR spectroscopy data of Br-ITIC-Br analyzed by NMR spectrometer is shown in the following: $^1$H NMR (500 MHz, CDCl$_3$): δ 8.85 (d, 1H), 8.79 (dd, 0.5H), 8.52 (dd, 0.5H), 8.21 (d, 1H), 7.99 (dd, 0.5H), 7.85-7.82 (m, 1H), 7.74 (dd, 0.5H), 7.62 (m, 1H), 7.19-7.10 (dd, 8H), 2.56-2.53 (m, 4H), 1.60-1.52 (m, 4H), 1.32 (dq, 12H), 0.84 (t, 6H).

After the synthesis of Br-ITIC-Br is completed, Br-ITIC-Br is then polymerized as a monomer to synthesize PITIC-Ph. The synthesis reaction of PITIC-Ph is shown in Table 3.

TABLE 3

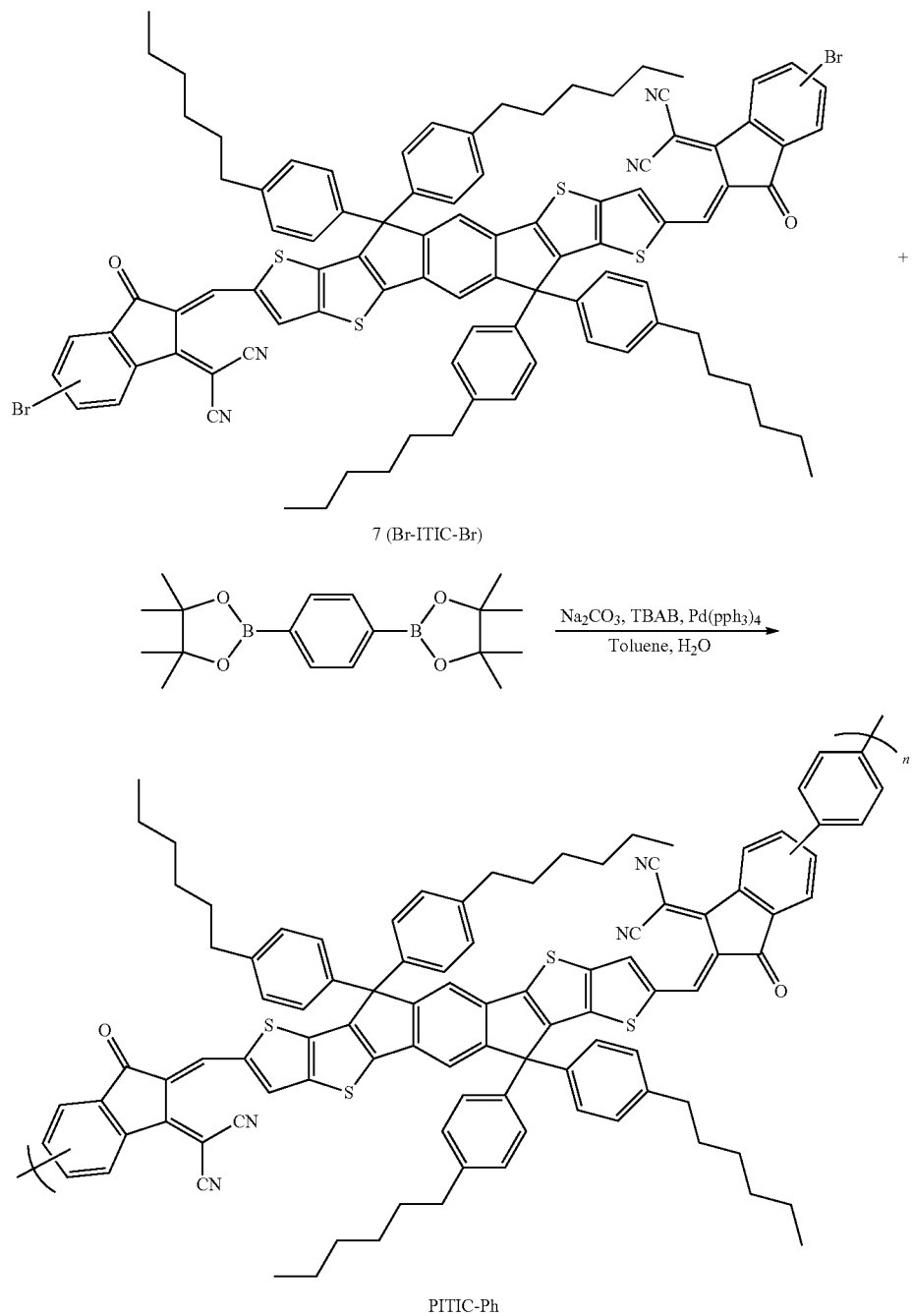

7 (Br-ITIC-Br)

PITIC-Ph

In detail, PITIC-Ph is prepared by Suzuki-Miyaura coupling polymerization, and the synthesis of PITIC-Ph is shown as follow. Monomer of Br-ITIC-Br (152 mg, 0.1 mmol), monomer of B-Ph-B (33 mg, 0.1 mmol), Na₂CO₃ (79 mg, 0.75 mmol), tetra-n-butylammonium bromide (TBAB) (1.6 mg, 0.005 mmol), Pd(PPh₃)₄ (9.0 mg, 0.008 mmol), toluene (10 mL) and water (2.5 mL) are injected into a sealed tube and to form a mixture. The mixture is degassed by bubbling with N₂ for 30 minutes and then heated at 120° C. for 72 hours. After cooling to room temperature, bromobenzene is added and then the mixture is heated at 120° C. for 6 hours, followed by addition of phenyl boronic acid and heating at 120° C. for another 6 hours. The mixture is cooled to room temperature and poured into MeOH and to obtain a precipitate. The precipitate is collected through membrane filtration. Purification of the polymer is performed through Soxhlet extraction with MeOH and hexane. The polymer is dissolved in hot CHCl₃, concentrated, and then precipitated in MeOH. The polymer is collected and dried under vacuum to finally obtain PITIC-Ph.

A Manufacturing Method for Example 2
(PITIC-PhF)

In the manufacturing method of Example 2, Br-ITIC-Br is prepared first, the end groups of the Br-ITIC-Br are replaced with PhF, and then polymerize it to PITIC-PhF, wherein the preparation of Br-ITIC-Br is described above, and it will not be described herein again. The synthesis reaction of PITIC-PhF is shown in Table 4.

TABLE 4

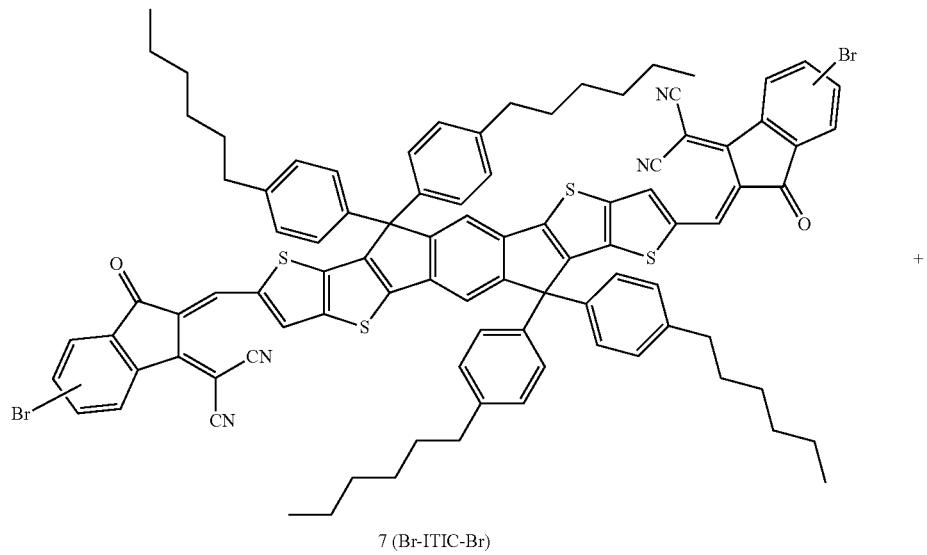

7 (Br-ITIC-Br)

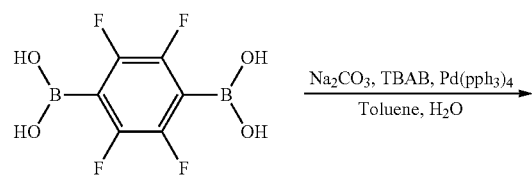

TABLE 4-continued

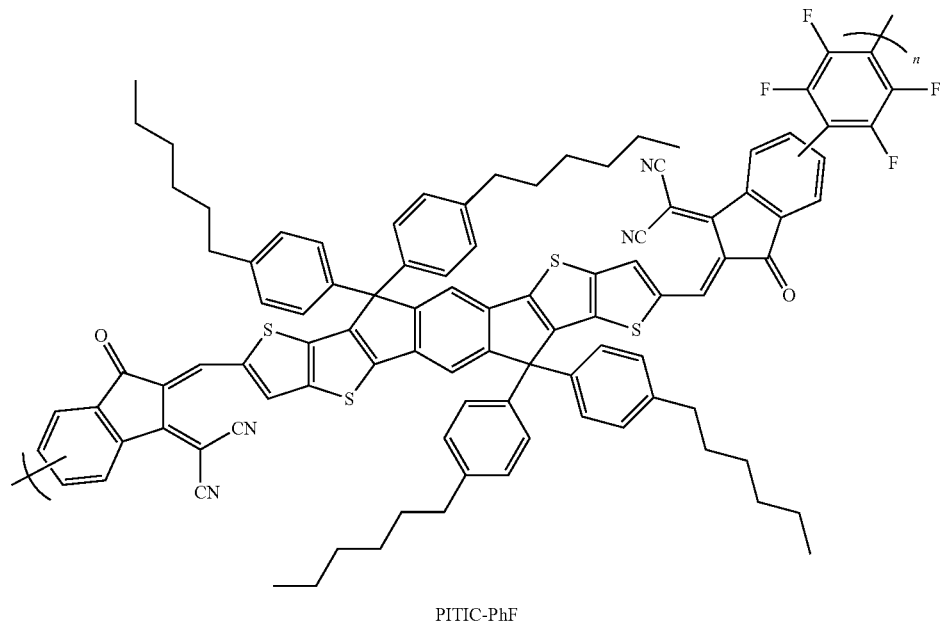

PITIC-PhF

PITIC-PhF is prepared by Suzuki-Miyaura coupling polymerization, and the synthesis of PITIC-PhF is shown as follow. Monomer of Br-ITIC-Br (158 mg, 0.1 mmol), (OH)$_2$B-PhF—B(OH)$_2$ (23.8 mg, 0.1 mmol), Na$_2$CO$_3$ (79 mg, 0.75 mmol), tetra-n-butylammonium bromide (1.6 mg, 0.005 mmol), Pd(PPh$_3$)$_4$ (9.0 mg, 0.008 mmol), toluene (10 mL) and water (2.5 mL) are injected into a sealed tube and to form a mixture. The mixture is degassed by bubbling with N$_2$ for 30 minutes and then heated at 150° C. for 72 hours. After cooling to room temperature, bromobenzene is added and then the sealed tube is heated at 120° C. for 6 hours, followed by addition of phenyl boronic acid and heating at 120° C. for another 6 hours. The mixture is cooled to room temperature and poured into MeOH and to obtain a precipitate. The precipitate is collected through membrane filtration. Purification of the polymer is performed through Soxhlet extraction with MeOH and hexane. The polymer is dissolved in hot CHCl$_3$, concentrated, and then precipitated in MeOH. The polymer is collected and dried under vacuum to finally obtain PITIC-PhF.

A Manufacturing Method for Example 3 (PBTP-PhF)

In the manufacturing method of PBTP-PhF, Br-BTP-Br is prepared first which is used as a monomer to polymerize into a non-fullerene acceptor polymer. The manufacturing process of PBTP-PhF will be described in detail below.

The synthesis reaction of Br-BTP-Br (Compound 9) is shown in Table 5.

TABLE 5

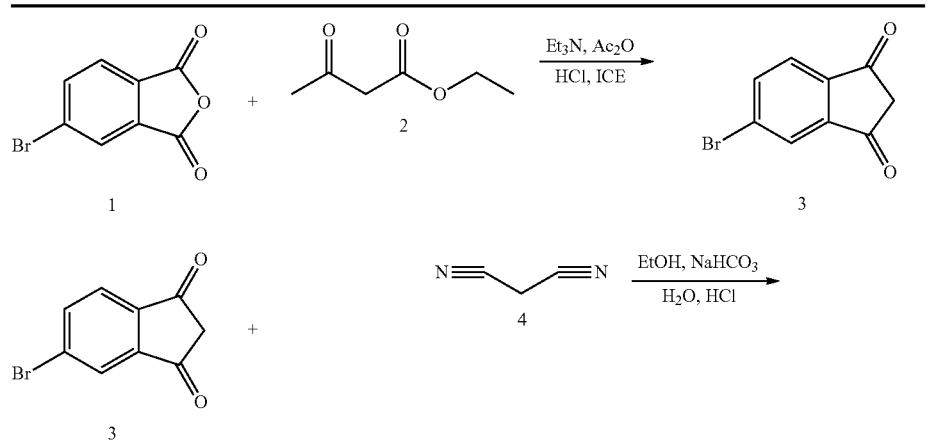

TABLE 5-continued

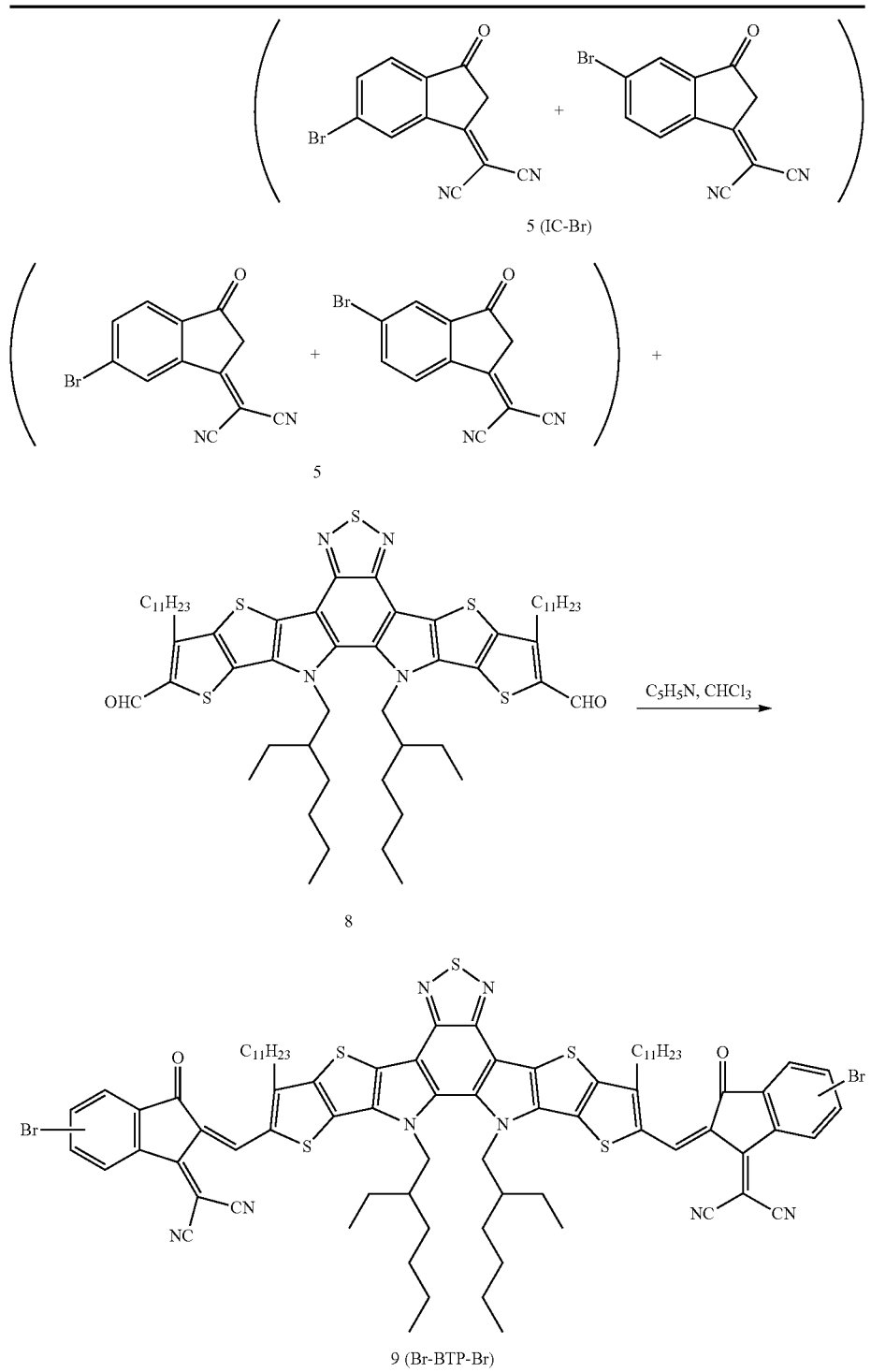

The synthesis of Br-BTP-Br is shown as follow. Compound 5 (558 mg, 2.04 mmol) and Compound 8 (400 mg, 0.38 mmol) are added to a 250 mL two-necked round bottom flask and to form a solution, wherein the manufacturing process of Compound 5 has been described in Example 1, and will not be described herein again. After being rinsed with a mild stream of nitrogen for 10 minutes, then anhydrous chloroform (100 mL) is added to the solution. Pyridine (2 mL) is added to reaction, the solution turned green gradually. Then, the solution is placed in an oil bath at 65° C. stirred and refluxed for 12 hours. After the reaction was completed, the solution is cooled to room temperature and a crude product is obtained. The crude product is poured to methanol (400 mL) so as to obtain a precipitate. Then the precipitate is filtered and purified by flash column (DCM/Hexane (1:1)) to finally obtain Br-BTP-Br (Compound 9).

The NMR spectroscopy data of Br-BTP-Br analyzed by NMR spectrometer is shown in the following: $^1$H NMR (500 MHz, CDCl$_3$): δ 8.85 (d, 1H), 8.79 (dd, 0.5H), 8.52 (dd, 0.5H), 8.21 (d, 1H), 7.99 (dd, 0.5H), 7.85-7.82 (m, 1H), 7.74 (dd, 0.5H), 7.62 (m, 1H), 7.19-7.10 (dd, 8H), 2.56-2.53 (m, 4H), 1.60-1.52 (m, 4H), 1.32 (dq, 12H), 0.84 (t, 6H).

After the synthesis of Br-BTP-Br is completed, Br-BTP-Br is then polymerized as a monomer to synthesize PBTP-PhF. The synthesis reaction of PBTP-PhF is shown in Table 6.

N$_2$ for 30 minutes and then heated at 120° C. for 72 hours. After cooling to room temperature, bromobenzene is added and then the mixture is heated at 120° C. for 6 hours, followed by addition of phenyl boronic acid and heating at 120° C. for another 6 hours. The mixture is cooled to room temperature and poured into MeOH and to obtain a precipitate. The precipitate is collected through membrane filtration. Purification of the polymer is performed through Soxhlet extraction with MeOH and hexane. The polymer is

TABLE 6

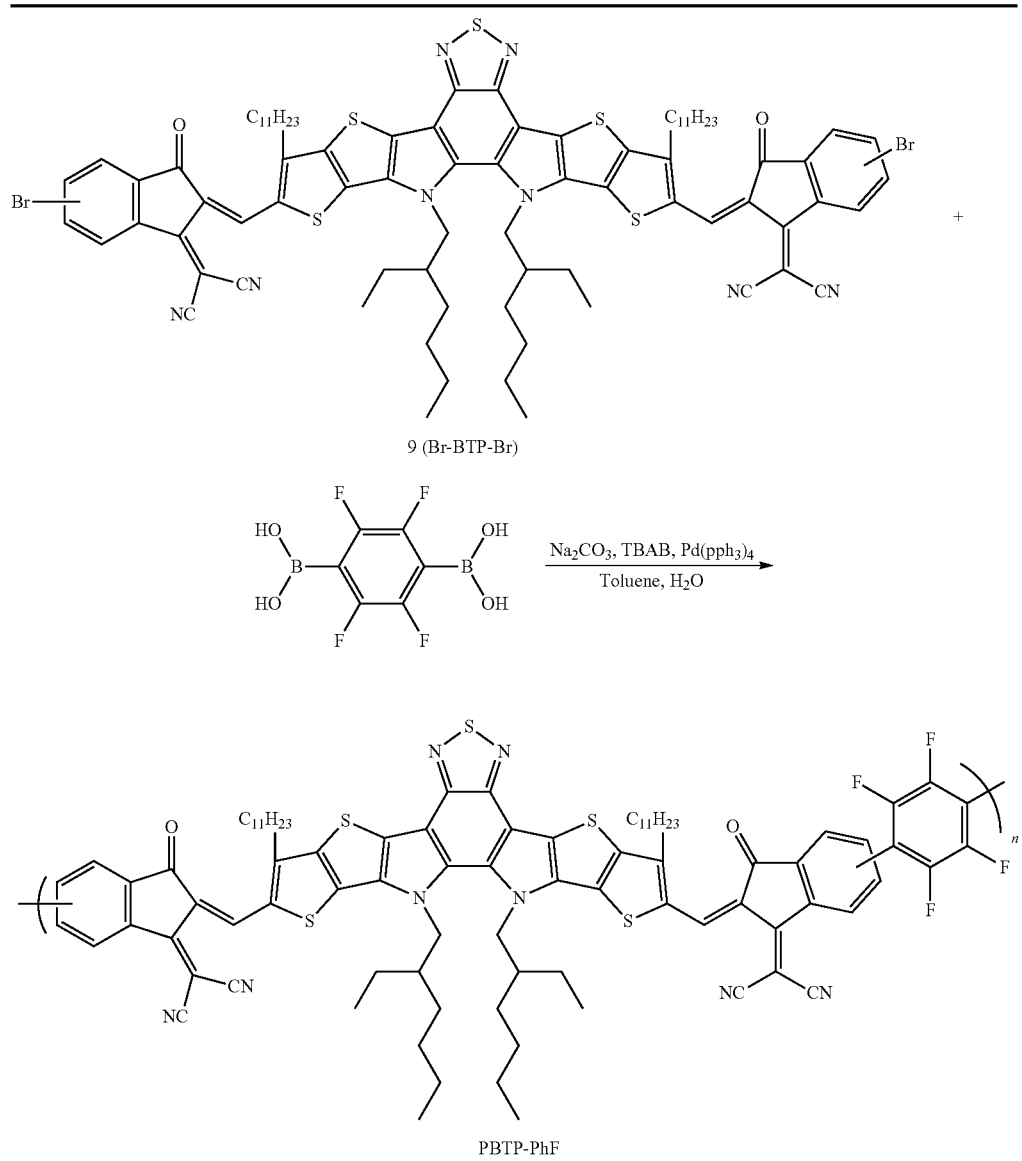

In detail, PBTP-PhF is prepared by Suzuki-Miyaura coupling polymerization, and the synthesis of PBTP-PhF is shown as follow. Monomer of Br-BTP-Br (154 mg, 0.1 mmol), B-PhF—B (33 mg, 0.1 mmol), Na$_2$CO$_3$ (79 mg, 0.75 mmol), tetra-n-butylammonium bromide (1.6 mg, 0.005 mmol), Pd(PPh$_3$)$_4$ (9.0 mg, 0.008 mmol), toluene (10 mL), and water (2.5 mL) are injected into a sealed tube and to form a mixture. The mixture is degassed by bubbling with dissolved in hot CHCl$_3$, concentrated, and then precipitated in MeOH. The polymer is collected and dried under vacuum to finally obtain PBTP-PhF.

Comparative Examples 1-3

Please refer to Table 7, the structural formulas and abbreviations of the non-fullerene acceptor polymer of Comparative Example 1, Comparative Example 2 and Comparative Example 3 of the present disclosure are shown in Table 7.

TABLE 7

| Comparative Example | structural formula | abbreviation |
|---|---|---|
| 1 | | PITIC-Th |
| 2 | | PITIC-ThF |
| 3 | | PBTP-ThF |

In order to more clearly illustrate the advantages of the non-fullerene acceptor polymer of the present disclosure, Examples 1 to 3 and Comparative Examples 1 to 3 are performed the property measurement and comparison. Specifically, Comparative Example 1 and Comparative Example 2 are ITIC-based non-fullerene acceptor polymer. The electron attracting end group of Comparative Example 1 is thiophene, and Comparative Example 1 is named PITIC-Th. The electron attracting end group of Comparative Example 2 is 3, 4 difluorothiophene, and Comparative Example 2 is named PITIC-ThF. Comparative Example 3 is BTP-based non-fullerene acceptor polymer. The electron attracting end group of Comparative Example 3 is 3, 4 difluorothiophene, and Comparative Example 3 is named PBTP-ThF. The synthesis reaction of Comparative Example 1 to Comparative Example 3 is shown in Table 8.

TABLE 8

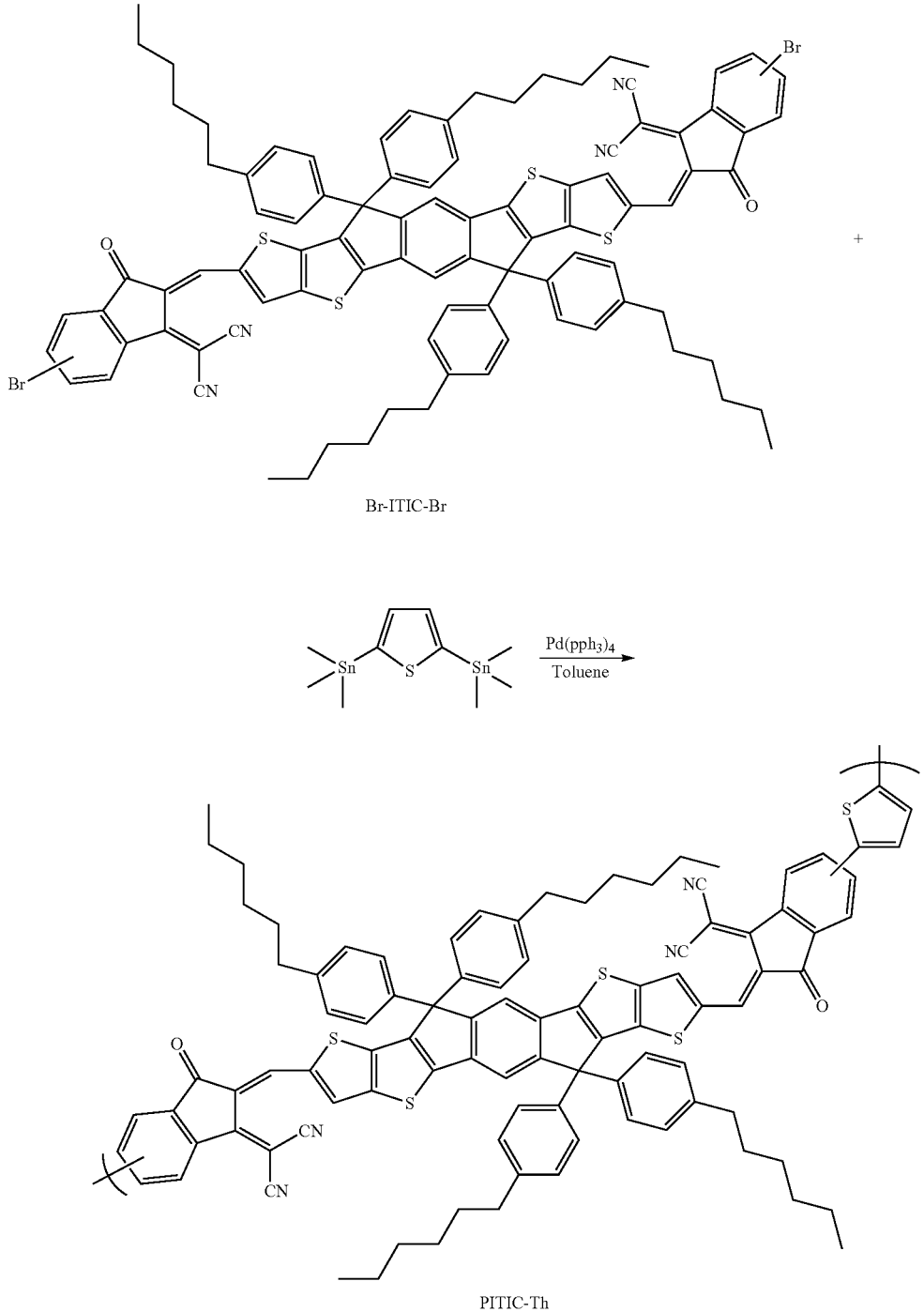

TABLE 8-continued
PITIC-ThF
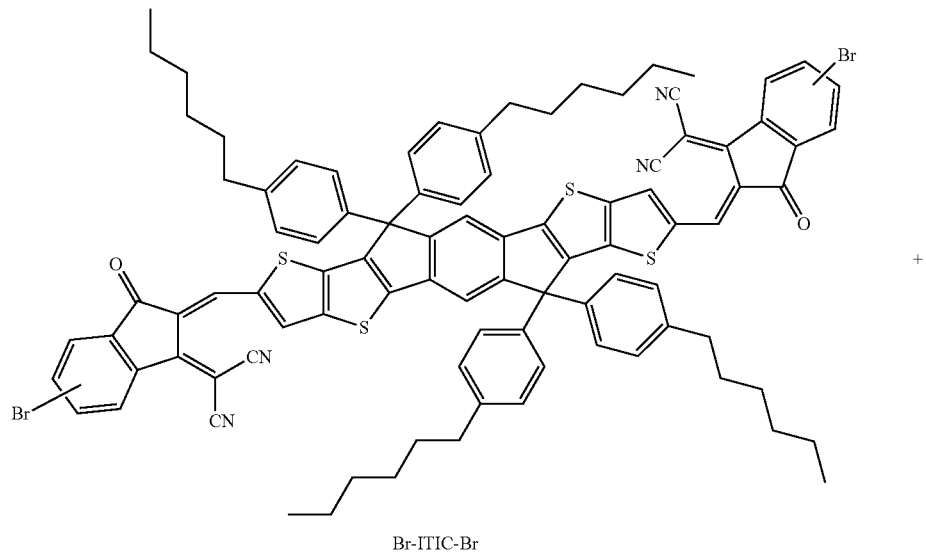
Br-ITIC-Br
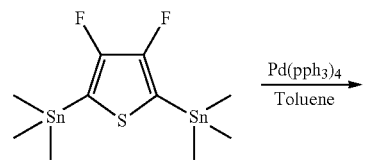
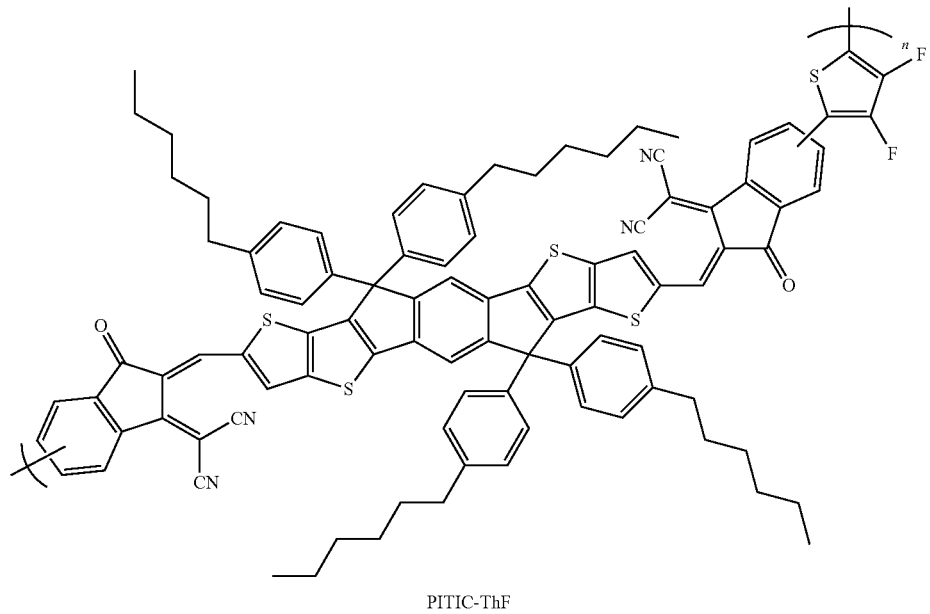
PITIC-ThF TABLE 8-continued PBTP-ThF

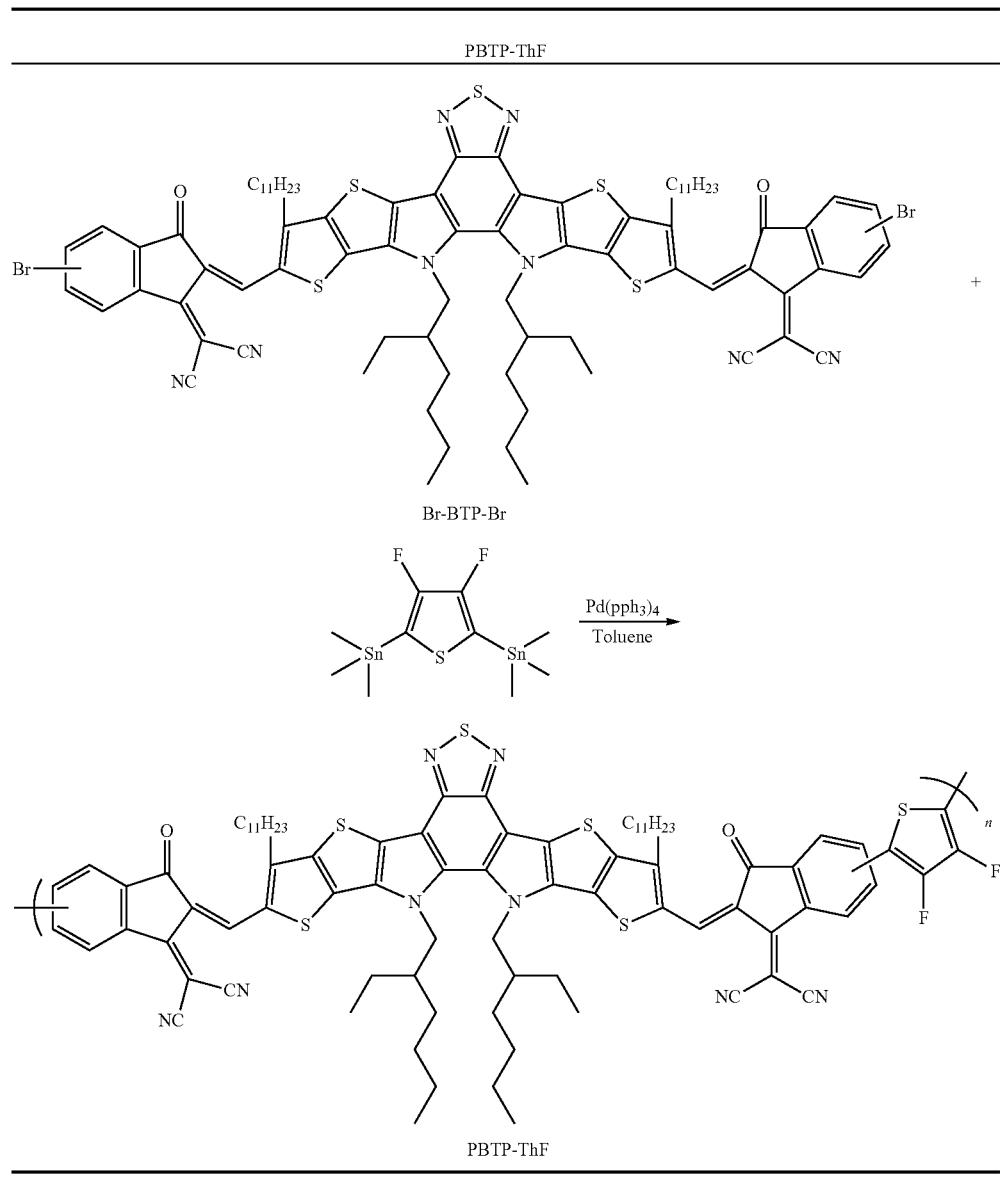

The Property Measurement

Figure 2:
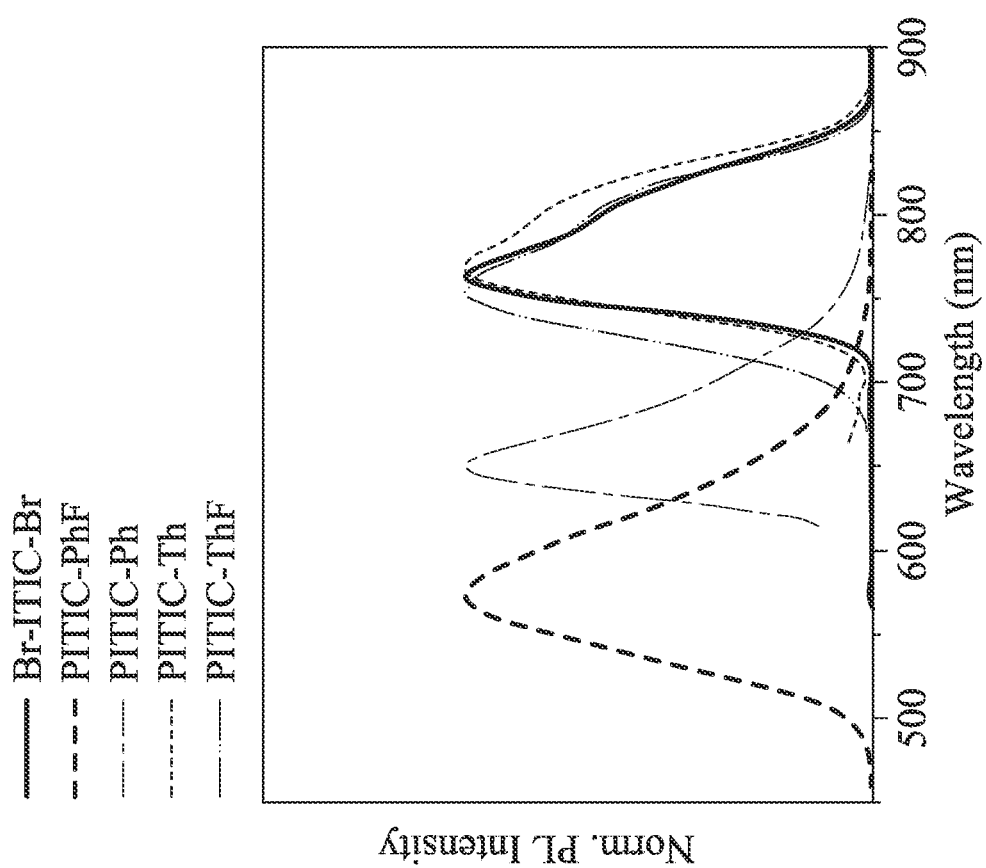
FIG. 2 is an emission spectra of Br-ITIC-Br, PITIC-PhF, PITIC-Ph, PITIC-Th and PITIC-ThF.

Please refer to FIG. 1 and FIG. 2. FIG. 1 is a UV-Vis absorption spectra of Br-ITIC-Br, PITIC-PhF, PITIC-Ph, PITIC-Th and PITIC-ThF. FIG. 2 is an emission spectra of Br-ITIC-Br, PITIC-PhF, PITIC-Ph, PITIC-Th and PITIC-ThF. Specifically, Br-ITIC-Br, PITIC-PhF, PITIC-Ph, PITIC-Th and PITIC-ThF are diluted in tetrahydrofuran (THF) to form a solution, respectively. Each of them is performed the UV-Vis absorption measurement and the emission measurement, respectively. As shown in FIG. 1, the initial absorption value of the monomer of Br-ITIC-Br is in the range of near infrared light (>750 nm). PITIC-Th, PITIC-ThF and monomer of Br-ITIC-Br have similar absorption characteristics and semiconductor energy gaps, and the initial absorption value thereof are all in the range of near infrared light (>750 nm). Notably, the initial absorption value of PITIC-Ph incorporating the phenyl linkers is in the range of the visible light (<650 nm), and the initial absorption value of PITIC-PhF is in the range of visible light (<600 nm). It is revealed that introducing phenyl led to a dramatic semiconductor energy gap change and an absorption value with blue-shift. It can be known that there are great differences between the non-fullerene acceptor polymer incorporating the phenyl linkers and the non-fullerene acceptor monomer and the non-fullerene acceptor polymer incorporating the thiophene linkers. Thus, the introduction of phenyl can widen the band gap of the non-fullerene acceptor polymer of present disclosure, potentially beneficial for inhibiting electron-hole recombination.

Further, as shown in FIG. 2, in comparison with the emission spectra, each maximum emission wavelength of Br-ITIC-Br, PITIC-Th and PITIC-ThF are in 780 nm which is in the range of near infrared ray. The emission wavelength of PITIC-Ph and PITIC-PhF incorporating the phenyl linkers are in the range of 660 nm and 580 nm, revealing that it has stronger fluorescent characteristics and ability to emit visible light.

Figure 3:
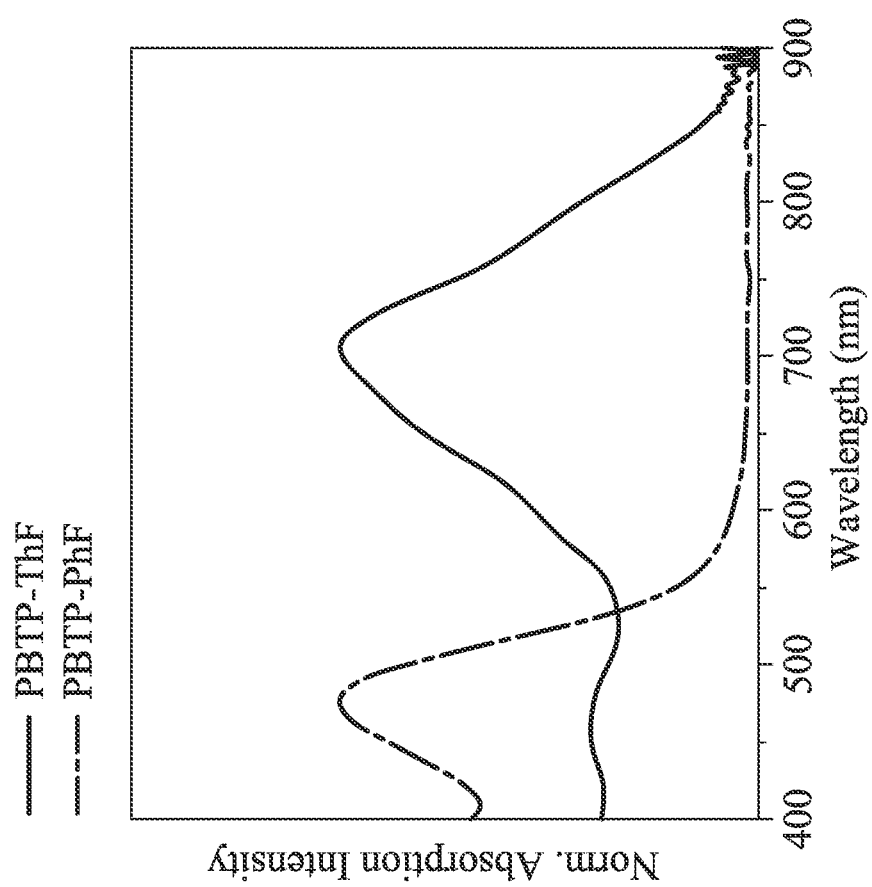
FIG. 3 is a UV-Vis absorption spectra of PBTP-ThF and PBTP-PhF.
Figure 4:
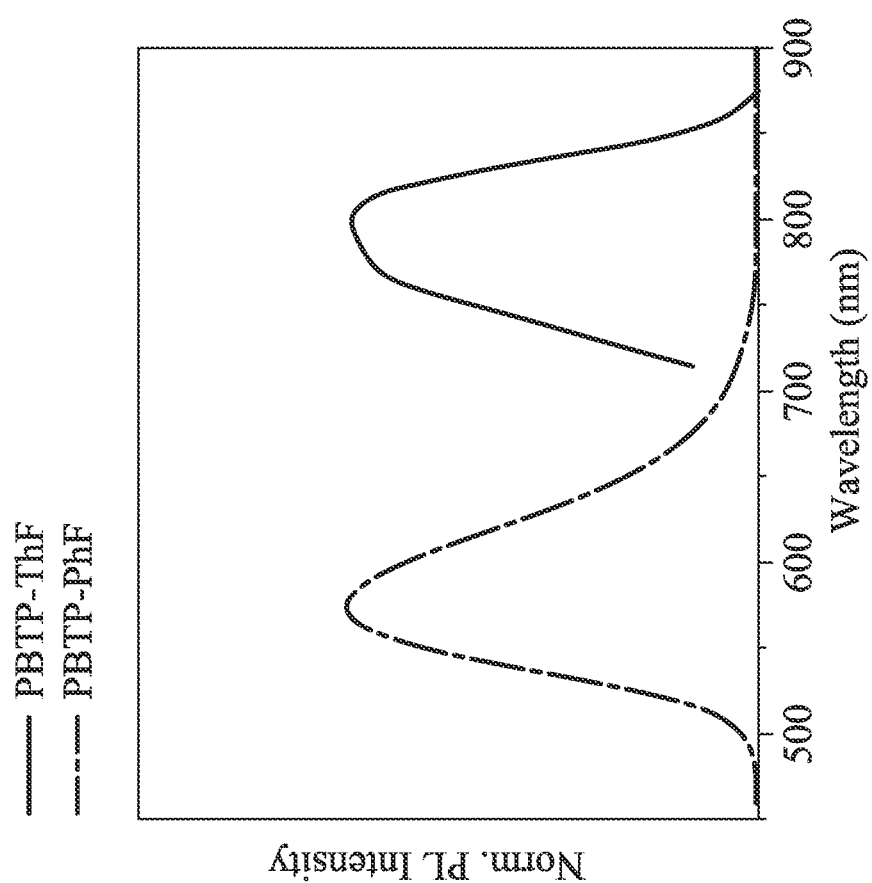
FIG. 4 is an emission spectra of PBTP-ThF and PBTP-PhF.

Please refer to FIG. 3 and FIG. 4. FIG. 3 is a UV-Vis absorption spectra of PBTP-ThF and PBTP-PhF. FIG. 4 is an emission spectra of PBTP-ThF and PBTP-PhF. As shown in FIG. 3, in comparison with PBTP-ThF, a dramatic semiconductor energy gap change and an absorption value with blue-shift are occurred with PBTP-PhF introducing phenyl. Further, as shown in FIG. 4, the emission wavelength of PBTP-PhF is in the range of visible light. Compared with PBTP-ThF, it has stronger fluorescent characteristics and ability to emit visible light.

Figure 5:
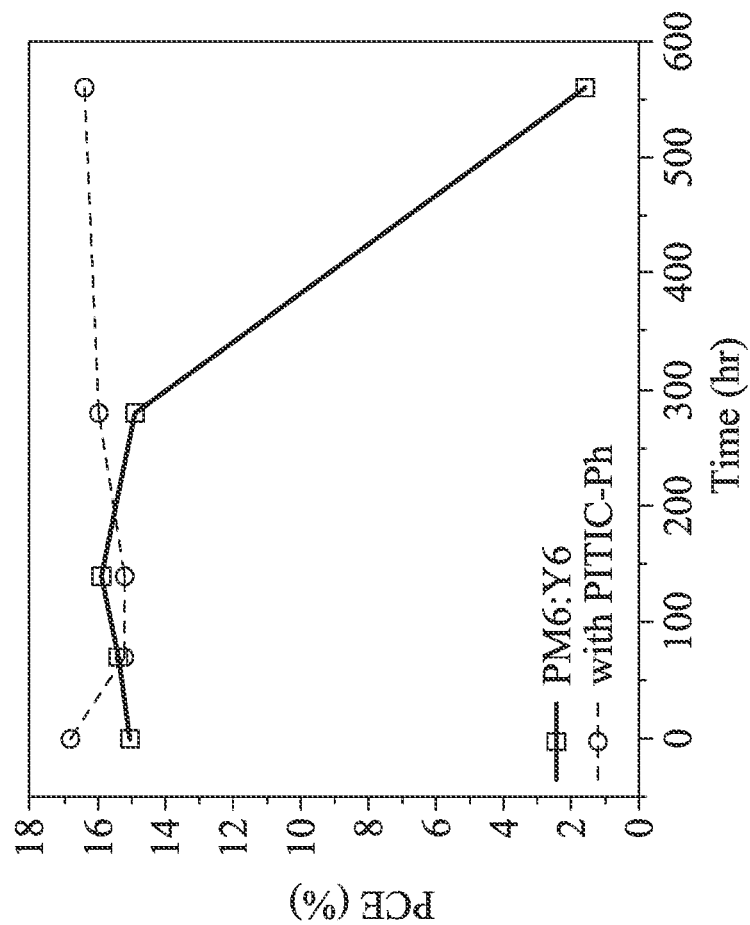
FIG. 5 is a thermal stability measurement result of an organic photovoltaic doped with PITIC-Ph and a general binary organic photovoltaic.

FIG. 5 is a thermal stability measurement result of an organic photovoltaic doped with PITIC-Ph and a general binary organic photovoltaic. Specifically, in order to show that the non-fullerene acceptor polymer of the present disclosure is beneficial to increase the thermal stability of organic photovoltaic, PITIC-Ph embedding as third components for ternary organic photovoltaic is compared with a binary organic photovoltaic (PM6:Y6), and the both two are put in a glove box and observing the state of annealing at 150° C.

As shown in FIG. 5, PCE of the organic photovoltaic doped with PITIC-Ph is 16.8%, revealing that it has high element efficiency. The organic photovoltaic embedding with PITIC-Ph retains high PCE at 16.4% after thermal annealing for 560 hours at 150° C. On the contrary, the PCE of the binary organic photovoltaic gradually decreases with the annealing time, and the performance decreased by over 80%. It can be seen that the non-fullerene acceptor polymer of the present disclosure is beneficial to increase the thermal stability of organic photovoltaic.

In summary, be compared with the non-fullerene acceptor monomer and the non-fullerene acceptor polymer linked with thiophene, the non-fullerene acceptor polymer of present disclosure can exhibit completely different semiconductor properties. Further, the non-fullerene acceptor polymer of present disclosure can have stronger ability to absorb and emit light in the visible light region. Therefore, the non-fullerene acceptor polymer of present is beneficial to expand the application field of non-fullerene acceptor polymers.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A non-fullerene acceptor polymer comprising a structure represented by formula (I):

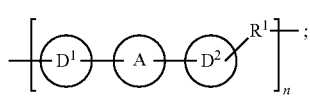

formula (I)

wherein A is an electron donating unit, $D^1$ and $D^2$ are an electron attracting end group, respectively, $R^1$ is 2,3,5,6-tetrafluoro-1,4-phenylene group, and n is an integer, wherein in the formula (I), A is a structure represented by formula (A-1) or formula (A-2):

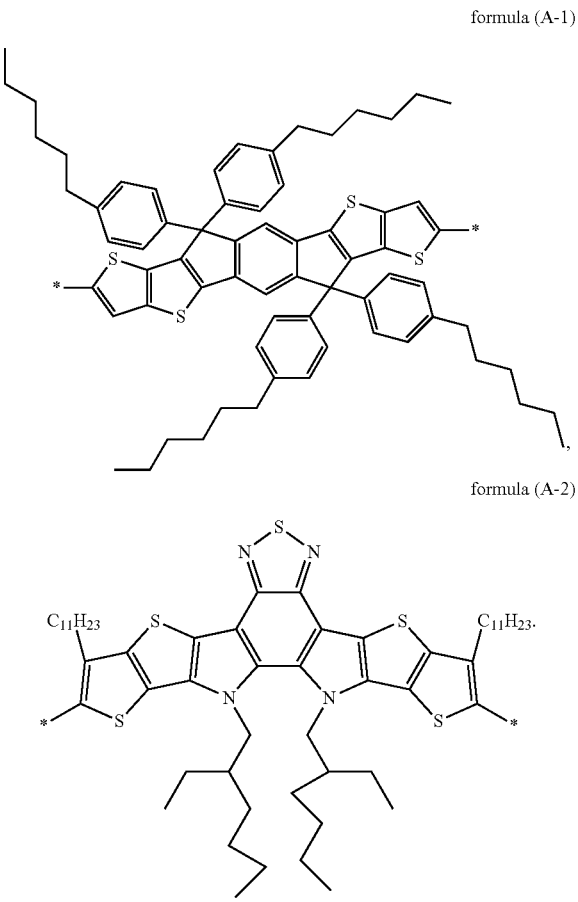

formula (A-1)

formula (A-2)

2. The non-fullerene acceptor polymer of claim 1, wherein the non-fullerene acceptor polymer uses $R^1$ as linkers to form a polymer.

3. The non-fullerene acceptor polymer of claim 1, wherein in the formula (I), $D^1$ and $D^2$ are the same or different from each other.

4. The non-fullerene acceptor polymer of claim 1, wherein the non-fullerene acceptor polymer is prepared by a non-fullerene acceptor compound which comprises a structure represented by formula (II):

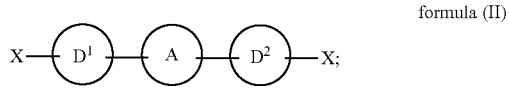

formula (II)

wherein X is a halogen or a functional group capable of polymer polymerization.

5. The non-fullerene acceptor polymer of claim 4, wherein in the formula (II), X is F, Cl, Br, I, boric acid pinacol ester, boric acid or organotin compound.

6. The non-fullerene acceptor polymer of claim 1, wherein in the formula (I), $D^1$ and $D^2$ are a structure represented by formula (D-1), respectively:

formula (D-1)
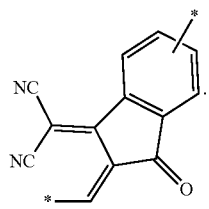
* * * * *

UNITED STATES PATENT AND TRADEMARK OFFICE
CERTIFICATE OF CORRECTION

| | |
|---|---|
| PATENT NO. | : 11,993,676 B2 |
| APPLICATION NO. | : 17/698771 |
| DATED | : May 28, 2024 |
| INVENTOR(S) | : Ho-Hsiu Chou et al. |

It is certified that error appears in the above-identified patent and that said Letters Patent is hereby corrected as shown below:

On the Title Page

Column 2, Item (56) Other Publications, Line 2, delete "phovoltaics" and insert -- photovoltaics --

Signed and Sealed this
Third Day of September, 2024

Katherine Kelly Vidal
*Director of the United States Patent and Trademark Office*